United States Patent
Park et al.

(10) Patent No.: US 10,447,286 B2
(45) Date of Patent: Oct. 15, 2019

(54) VAPOR CELL COMPRISING ELECTRO-OPTIC FUNCTION FOR CHIP-SCALE ATOMIC CLOCK, AND METHOD FOR MANUFACTURING SEALED CONTAINER FOR CHIP-SCALE INSTRUMENT

(71) Applicant: KOREA ADVANCED INSTITUTE OF SCIENCE AND TECHNOLOGY, Daejeon (KR)

(72) Inventors: Jong Cheol Park, Seoul (KR); Hee Yeoun Kim, Daejeon (KR); Chung Mo Yang, Daejeon (KR); Tae Hyun Kim, Seoul (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 39 days.

(21) Appl. No.: 15/747,734

(22) PCT Filed: Jul. 29, 2016

(86) PCT No.: PCT/KR2016/008332
§ 371 (c)(1),
(2) Date: Jan. 25, 2018

(87) PCT Pub. No.: WO2017/018846
PCT Pub. Date: Feb. 2, 2017

(65) Prior Publication Data
US 2018/0212612 A1 Jul. 26, 2018

(30) Foreign Application Priority Data
Jul. 30, 2015 (KR) .......................... 10-2015-0108253

(51) Int. Cl.
*G04F 5/14* (2006.01)
*H03L 1/04* (2006.01)
(Continued)

(52) U.S. Cl.
CPC .............. *H03L 7/26* (2013.01); *B81B 7/0038* (2013.01); *G04F 5/14* (2013.01);
(Continued)

(58) Field of Classification Search
CPC ..... G04F 5/14; G04F 5/145; H01L 21/02532; H03B 17/00; H03L 1/02; H03L 1/04; H03L 7/26; Y10T 29/49002
(Continued)

(56) References Cited

U.S. PATENT DOCUMENTS

| 8,526,000 B1* | 9/2013 | Schober ................ G02B 27/00 356/432 |
| 2005/0007118 A1* | 1/2005 | Kitching .................. G04F 5/14 324/464 |

(Continued)

FOREIGN PATENT DOCUMENTS

| CN | 102259825 A | 11/2011 |
| JP | 2009-176852 | 8/2009 |

(Continued)

*Primary Examiner* — Levi Gannon
(74) *Attorney, Agent, or Firm* — Mayer & Williams, PC; Stuart H. Mayer

(57) ABSTRACT

According to the present invention, since a silicon body itself supporting first and second glass substrates also has a role of an electric heating device, the temperature of the inside of a through-part can be maintained to be constant. In addition, since it is unnecessary to comprise a separate electric heating device such as a heater or to form an additional heating pattern in order to control the temperature of the inside of the through-part, a process for manufacturing a vapor cell can be simplified. According to the present invention, only a reactive material in a gas state and a buffer gas can be injected into a sealed container without the intervention of other materials, and the size of the sealed (Continued)

container can be reduced since it is unnecessary to prepare e separate space for mounting a pill of the reaction material in a vapor cell region itself.

15 Claims, 7 Drawing Sheets

(51) Int. Cl.
    *H03L 7/26*     (2006.01)
    *H01L 21/02*     (2006.01)
    *B81B 7/00*     (2006.01)

(52) U.S. Cl.
    CPC .......... *H01L 21/02532* (2013.01); *H03L 1/04* (2013.01); *B81C 2203/0118* (2013.01); *B81C 2203/031* (2013.01)

(58) Field of Classification Search
    USPC .................................................. 331/3, 94.1
    See application file for complete search history.

(56) References Cited

U.S. PATENT DOCUMENTS

2005/0184815 A1    8/2005    Lipp et al.
2012/0206135 A1*    8/2012    Nagasaka .............. G01R 33/26
    324/244.1
2013/0015920 A1*    1/2013    Sato .......................... G04F 5/14
    331/94.1
2013/0047417 A1*    2/2013    Nagasaka .......... G01R 33/0076
    29/592.1
2014/0139294 A1*    5/2014    Harasaka .................. H03L 7/26
    331/1 R
2014/0306700 A1*    10/2014    Kamada ................ G01R 33/26
    324/244.1
2015/0054591 A1*    2/2015    Adachi ..................... H03L 7/26
    331/94.1
2015/0107097 A1*    4/2015    Nagasaka ............ G01R 33/032
    29/731
2015/0226669 A1*    8/2015    Compton ........... G01N 21/6404
    250/432 R
2016/0308543 A1*    10/2016    Ishihara .................... H03L 7/26
2018/0210403 A1*    7/2018    Maurice .................... G04F 5/14

FOREIGN PATENT DOCUMENTS

JP    2012-198183    10/2012
JP    2013-038382    2/2013

* cited by examiner

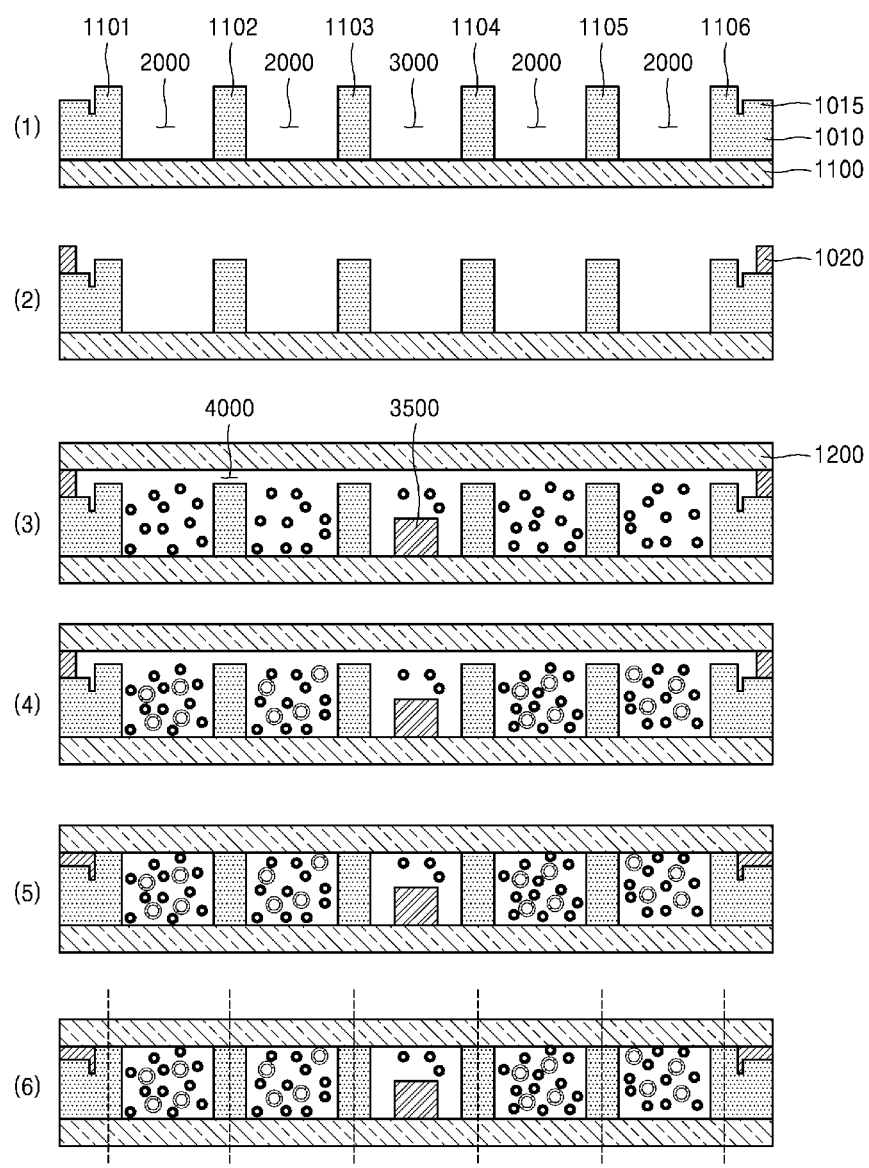

VAPOR CELL COMPRISING ELECTRO-OPTIC FUNCTION FOR CHIP-SCALE ATOMIC CLOCK, AND METHOD FOR MANUFACTURING SEALED CONTAINER FOR CHIP-SCALE INSTRUMENT

TECHNICAL FIELD

The present invention relates to a vapor cell that can be used for a chip-scale atomic clock, and in particular to a vapor cell having an electro-optic function. The present invention also relates to a method for manufacturing a container sealed with a reactive substance in a gaseous state and a buffer gas, which can be used in a chip-scale device.

BACKGROUND

Chip-scale devices refer to devices whose size is sufficiently small so that they can be easily integrated into an integrated circuit or chip, and are generally materialized in 25 mm or less. Examples of chip-scale devices include switches, sensors, gyroscopes, accelerometers, atomic clocks, etc. In order to manufacture these chip-scale devices, technology that can produce a required shape of a fine size without changing electrical, mechanical or chemical properties is required.

Thus, chip-scale devices are manufactured using MEMS (Micro Electro Mechanical System) based on the semiconductor process technology, and more specifically, chip-scale devices can be manufactured by precisely processing material such as silicon, glass and the like based on MEMS.

An atomic clock, which is one of the chip-scale devices listed in the above examples, is an electronic timing device produced on the basis of the natural resonance frequency of atoms. The atomic clock utilizes the phenomenon of emitting or absorbing electromagnetic waves corresponding to the difference in a changed energy level when the energy level of certain atom changes to another energy level, which provides a high level of accuracy.

The atomic clock may be constituted by a physical part for changing the energy levels of atoms and detecting them, and a control part for determining the time interval by using the detected energy levels.

Among them, the physical part may be constituted by including a light generating unit (for example, a laser diode such as VCSEL) for generating a laser beam having a specific wavelength, an optical element for focusing the laser beam generated in the light generating unit, a vapor cell where atoms are accommodated in a space isolated from the outside and the focused laser light is incident and emitted, and a photo-detecting unit (for example, a photodiode) which receives the light emitted from the vapor cell and detects a change in the energy level of the atom.

In order to operate the atomic clock to show an increased accuracy in the time interval, it is needed that a sealed space in which atoms can be contained and isolated inside the vapor cell is provided, and the temperature of the sealed space is generally kept constant so that atoms can have a relatively equal operating temperature.

On the other hand, in Non-Patent Document 1 (Microfabricated alkali atom vapor cells with in-situ heating for atomic-based sensors, Liew L, Proc. 3rd Int. Symp. Sensor Science, 2005), additional silicon structures beside a silicon body constituting a vapor cell is prepared, and the temperature of a cavity accommodating the atoms is controlled by the structures. However, in this case, there are such problems that it is difficult to keep the temperature inside the cavity to be constant in general, so that the accuracy of the atomic clock is deteriorated. Also, since it is required to form an additional silicon structure, the manufacturing process of the vapor cell becomes complicated.

Meanwhile, the vapor cell which is one of components of the physical part contains vaporized alkali atoms (for example, cesium Cs or rubidium Rb). If only alkali atoms are injected into the vapor cell and subject to optical pumping, a stable frequency detection becomes difficult due to the collision of the activated atoms to the vapor cell wall, the Doppler effect according to their high speed movements or the like. Thus, a buffer gas for appropriately restraining alkali atoms is injected together.

Reviewing prior techniques for injecting alkali atoms and a buffer gas into a vapor cell, in Non-patent Document 2 (Microfabricated alkali atom vapor cells, L.-A. Liew, APPLIED PHYSICS LETTERS, 2004,) alkali atoms are extracted from a sealed vessel based on the following reaction formula.

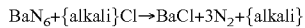

$$BaN_6 + \{alkali\}Cl \rightarrow BaCl + 3N_2 + \{alkali\}$$

Specifically, according to Non-patent Document 2, barium azide $BaN_6$ is mixed with cesium chloride CsCl or rubidium chloride RbCl and injected into a vapor cell filled with a specific buffer gas, and the reaction is then activated at a high temperature of 300° C. to extract alkali atoms of nitrogen $N_2$, cesium or rubidium together with barium chloride BaCl. However, in the above method, there is a problem that coagulated barium chloride remains inside the vapor cell, and not only the buffer gas and the vaporized alkali atoms but also nitrogen are similarly generated.

In order to solve these problems, Non-patent Document 3 (Wafer-level filling of microfabricated atomic vapor cells based on thin-film deposition and photolysis of cesium axide, L.-A. Liew, APPLIED PHYSICS LETTERS, 2007) describes a method in which liquid cesium azide $CsN_3$ is injected into a vapor cell filled with a specific buffer gas and sealed, and then liquid cesium azide is activated using ultraviolet light. According to Non-Patent Document 3, although solidified barium chloride does not remain inside the vapor cell, there is a problem that nitrogen is generated in addition to the buffer gas and vaporized alkali atoms.

On the other hand, Non-Patent Document 4 (Microfabrication of cesium vapor cells with buffer gas for MEMS atomic clocks, M. Hasegawa, Sensors and Actuators A, 2011) proposes a method of using a Cs dispenser. Specifically, according to Non-Patent Document 4, Cs pill (a mixture of $CsCrO_4$ and Zr—Al alloy) is additionally accommodated and sealed in a vapor cell filled with a specific buffer gas, and then activated at a high temperature of 700° C., whereby only Cc atoms can be injected into the sealed vapor cell. However, according to Non-Patent Document 4, since an additional space for the dispenser is required in the vapor cell, the size of the vapor cell is increased, large power consumption occurs, and the productivity is reduced since Cs pill is injected and activated for each vapor cell.

DETAILED DESCRIPTION

Technical Problems to be Solved

The present invention has been devised in order to solve the above problems, and it is an object of the present invention to provide a vapor cell capable of keeping the inside of a through-part containing a reactive substance at a constant temperature as a whole.

In addition, it is another object of the present invention to provide a vapor cell which can solve the difficulty of integrating and arranging a light generating part, an optical element, a vapor cell and a light detecting part in a row in a physical part constituting an atomic clock, and reduce the size of the physical part.

Further, the present invention has been devised in order to solve the above problems, and it is an object of the present invention to provide a method for manufacturing a sealed container in which only a reactive substance in a gaseous state and a buffer gas are injected into a vapor cell region and sealed without the intervening of another substance.

Moreover, it is another object of the present invention to reduce the size of a sealed container into which a reactive substance in a gaseous state and a buffer gas are injected to minimize the power consumption, thereby increasing the productivity of the sealed container as described above.

Means for Solving the Problems

In order to achieve the above objects, a vapor cell having an electro-optical function for a chip-scale atomic clock according to the present invention may be characterized by comprising: a silicon body having a through-part which is a space where a reactive substance is contained; a first glass substrate which is disposed on one surface of the silicon body and closes one side of the through-part; and a second glass substrate which is disposed on the other surface of the silicon body and closes the other side of the through-part, wherein a voltage is applied to the silicon body to control a temperature inside the through-part.

At this time, the vapor cell may be characterized in that the through-part is positioned at a center of the silicon body.

Also, the vapor cell may be characterized in that a predetermined amount of a p-type or n-type impurity is implanted into the silicon body.

Also, the vapor cell may be characterized in that the shape of the silicon body is a 2n (n is an integer of 3 or more) polygonal or cylindrical column.

Also, the vapor cell may further comprises a first concave portion which is provided to the first glass substrate and continuously connected to one side of the through-part, and a collimator which is disposed in the first concave portion and converts the light incident on the first glass substrate into a parallel light.

Also, the vapor cell may further comprises a first concave portion which is provided to the first glass substrate and continuously connected to one side of the through-part, and a second concave portion which is provided to the second glass substrate and continuously connected to the other side of the through-part.

Also, the vapor cell may further comprises a metal terminal for wiring to external conductors at both opposing ends of the silicon body relative to the through-part.

Also, in order to achieve the aforementioned objects, a method for manufacturing a sealed container for a chip-scale device according to one embodiment of the present invention may comprise the steps of: (A) forming a silicon body on and between opposite ends of a lower glass substrate so as to be partitioned into a vapor cell region and a dispensing region on the lower glass substrate, and providing a channel through which a reactive substance can be communicated between the vapor cell region and the dispensing region; (B) injecting a buffer gas into the vapor cell region and accommodating a reactive substance pill in the dispensing region; (C) sealing the buffer gas from the outside by bonding an upper glass substrate to an upper portion of the silicon body formed at the opposite ends; (D) activating the reactive substance pill to inject the reactive substance of a gaseous state through the channel into the vapor cell region; (E) locally heating a portion of the upper glass substrate which corresponds to the channel to close the channel; and (F) dicing the silicon body formed between the opposite ends, the lower glass substrate and the upper glass substrate adjacent thereto in a height direction of the silicon body formed between the opposite ends.

The method may be characterized in that the channel is provided by making the height of the silicon body formed on the opposite ends of the lower glass substrate equal and forming the height of the silicon body formed between the opposite ends is lower than the height of the silicon body formed on the opposite ends.

Alternatively, the method may be characterized in that the channel is provided by making the height of the silicon body formed on and between the opposite ends of the lower glass substrate equal and forming a concave portion on an upper surface of the silicon body formed between the opposite ends of the lower glass substrate.

At this time, the method may be characterized in that the dispensing region is one, and the vapor cell region is plural.

The method may further comprise polishing a surface of the upper glass substrate after the step (E).

On the other hand, a method for manufacturing a sealed container for a chip-scale device according to another embodiment of the present invention may comprise the steps of: (a) forming a silicon body having an equal height on and between opposite ends of a lower glass substrate so as to be partitioned into a vapor cell region and a dispensing region on the lower glass substrate, and forming a sub silicon body which has a height lower than a height of the silicon body adjacent to the silicon body formed on the opposite ends; (b) depositing a bonding portion on the sub silicon body such that a total height including the height of the sub silicon body and a height of the bonding portion is higher than the height of the silicon body; (c) injecting a buffer gas into the vapor cell region and accommodating a reactive substance pill in the dispensing region; (d) sealing the buffer gas from the outside by bonding an upper glass substrate to an upper portion of the bonding portion; (e) activating the reactive substance pill to inject the reactive substance of a gaseous state into the vapor cell region; (f) melting the bonding portion to bond the upper glass substrate to an upper portion of the silicon body; and (g) dicing the silicon body formed between the opposite ends, the lower glass substrate and the upper glass substrate adjacent thereto in a height direction of the silicon body formed between the opposite ends.

The method may be characterized in that the bonding portion is a metal mixture having a melting point lower than melting points of the silicon body and the sub silicon body, and the step (f) is carried out at a higher temperature than the step (d).

Alternatively, the method may be characterized in that the bonding portion is a glass frit having a glass transition temperature lower than melting points of the silicon body and the sub silicon body, and the step (f) is carried out at a higher temperature than the step (d).

At this time, the method may be characterized in that a guiding portion is further provided, and when the upper glass substrate is bonded to the upper portion of the silicon body in the step (f), the bonding portion is melted and drawn into the guiding portion.

At this time, the method may be characterized in that the dispensing region is one, and the vapor cell region is a plural.

Effects of the Invention

According to the present invention, the silicon body having the through-part, together with the first glass substrate and the second glass substrate, cannot only provide the sealed space in which the reactive substance is isolated from the outside, but also keep the temperature inside the through-part to be constant as a whole since the silicon body itself functions as an electric heating device. Therefore, the operating temperature environment of the reactive substance contained in the through-part can be constantly controlled, thereby contributing to the improvement of the accuracy of the atomic clock.

Further, according to the present invention, since it is unnecessary to provide another electric heating device or to form an additional heating pattern in order to adjust the temperature inside the through-part, it is possible to simplify the fabrication process of the vapor cell.

In addition, if the collimator is integrally provided in the vapor cell, it is possible to simplify the complicated integration process to arrange the light generating unit, the optical element, the vapor cell and the light detecting unit in a row at the time of fabricating the physical part.

On the other hand, according to the method for manufacturing a sealed container according to the present invention, unlike prior methods, only the reactive substance in the gaseous state and the buffer gas can be injected without interposing other substances in the sealed container.

In addition, since it is unnecessary to provide a separate space for accommodating the reactive substance pill in the vapor cell region itself, it is possible to reduce the size of the sealed container, whereby the power consumption supplied to the sealed container can be reduced.

Further, the present invention may have a plurality of vapor cell regions and only one dispensing region, thereby greatly improving the productivity of the sealed container.

BRIEF DESCRIPTION OF THE DRAWINGS

FIG. 10 is a diagram showing a method of manufacturing a sealed container according to another embodiment of the present invention.

PREFERRED EMBODIMENTS FOR PRACTICING THE INVENTION

Figure 1:
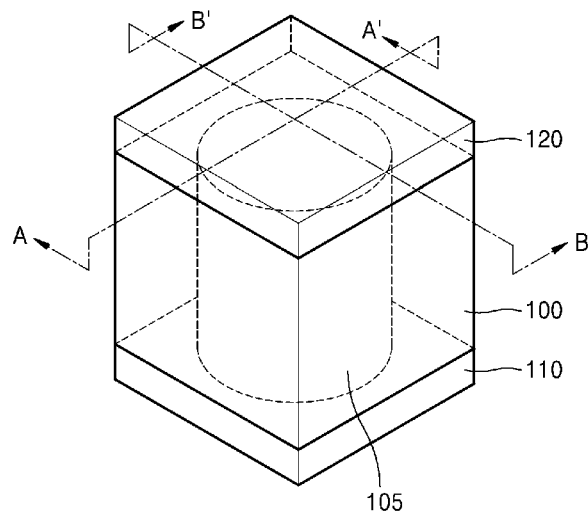
FIG. 1 is a perspective view of a vapor cell according to one embodiment of the present invention.

Hereinafter, a vapor cell with an electro-optic function for a chip-scale atomic clock according to the present invention will be described in detail with reference to the accompanying drawings. It should be appreciated that although the accompanying drawings are included to provide a thorough understanding of the technical spirit of the present invention to a person skilled in the art, the present invention is not limited only to the accompanying drawings and can be embodied in other forms within the scope that does not change the technical idea of the present invention.

In addition, the same reference numerals in the drawings denote the same constituent elements. Detailed descriptions about known functions and configurations which may unnecessarily obscure the gist of the present invention may be omitted.

Figure 2:
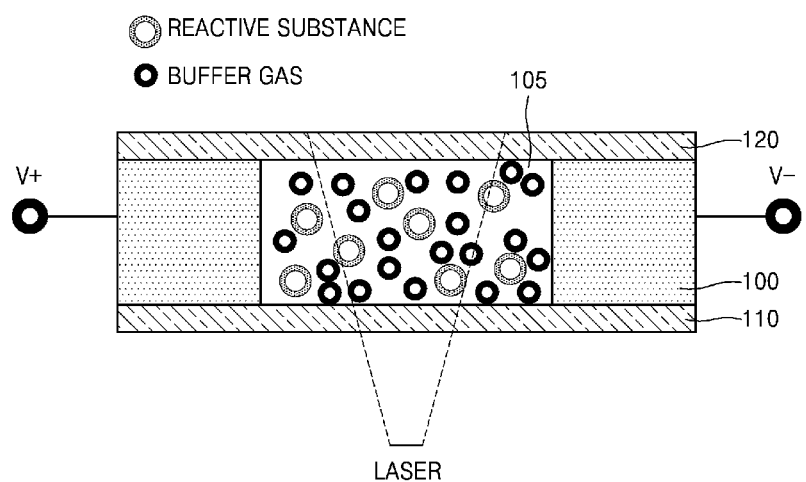
FIG. 2 is a cross-sectional view taken along line A-A' of FIG. 1.

FIG. 1 is a perspective view of a vapor cell according to one embodiment of the present invention, and FIG. 2 is a cross-sectional view taken along the line A-A' of FIG. 1.

In a vapor cell constituting a chip-scale atomic clock, a space in which a reactive substance can be accommodated is required, and alkali atoms such as cesium Cs or rubidium Rb may be included as the reactive substance contained in the space. Also, the space in which the reactive substance is contained is required to be sealed from the outside, which is to ensure the accuracy of the atomic clock by preventing the reactive substance from being affected by external heat or magnetic field.

Further, in order to accurately detect the change in the energy level of the reactive substance by means of the light (for example, laser light) generated in a light generating unit (not shown), the temperature inside the sealed space is required to be kept constant, and In order to optically pump a reactive substance. It is also required that glass substrates are provided on one side on which the laser light is incident and the other side opposing the one side, respectively.

Referring to FIGS. 1 and 2, a silicon body 100 has a through-part 105. The through-part 105 corresponds to the space in which the reactive substance is contained and has a cylindrical shape in general. A predetermined buffer gas may be contained together with the reactive substance in the through-part 105.

Glass substrates 110, 120 are provided on lower and upper portions of the silicon body 100 for respectively allowing the light generated from the light generating part to enter and exit through the lower and upper glass substrates.

Specifically, the first glass substrate 110 is disposed on one surface of the silicon body 100 in a manner of closing one side of the through-part 105, and the second glass substrate 120 is disposed on the other surface of the silicon body 100 in a manner of closing the other side of the through-part 105.

The sealing of the reactive substance may be carried out such that after injection of the reactive substance into the through-part 105 with its one side blocked by the first glass substrate 110, the other side of the through-part 105 is then closed by the second glass substrate 120.

In the past, in order to create an operating temperature environment of a reactive substance, such methods were used that a separate electric heating device was provided or a heating pattern was formed on surfaces of the first glass substrate 110 and the second glass substrate 120 on which the laser light is incident and emitted, or an additional silicon pattern was formed inside the through-part 105. However, these methods caused unevenness in temperature inside the through-part or required additional manufacturing steps such as pattern formation, etc., thereby resulting in troubles in the process.

Thus, the present invention is configured such that the silicon body 100 having the through-part 105, together with the first glass substrate 110 and the second glass substrate 120, provides a sealed space which can separate the reactive substance from the outside, while functioning as an electric heating device which can provide heat into the inside of the through-part 105, thereby making it possible to control the temperature inside the through-part 105 and thus to heat the reactive substance without preparing an additional electric heating device or heating pattern.

Figure 3:
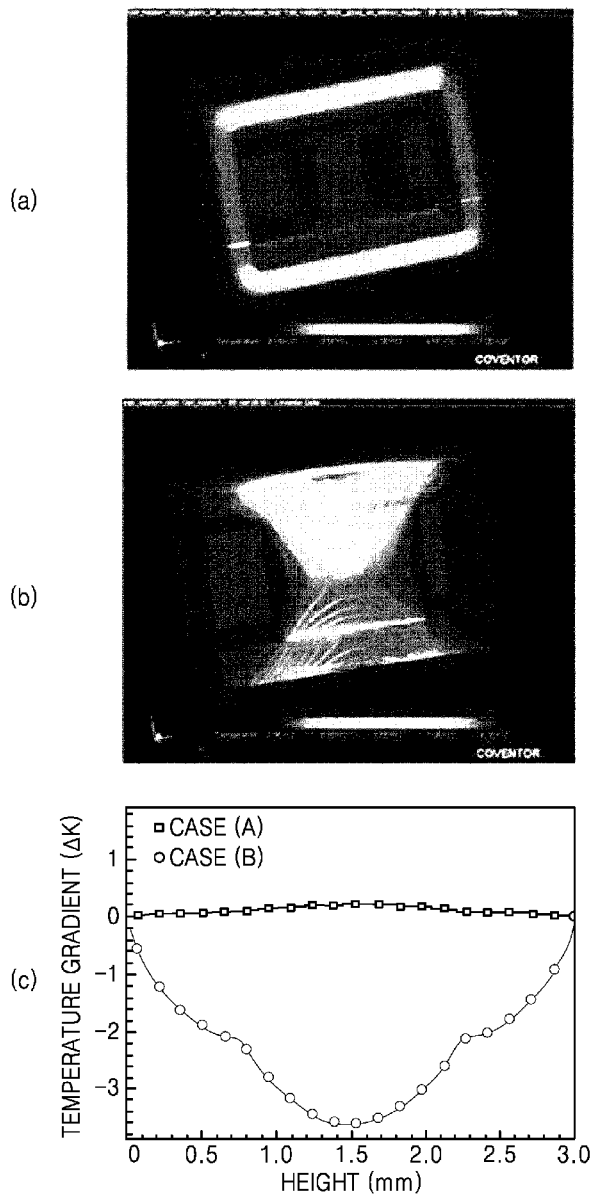
FIG. 3 is a diagram for comparison showing a temperature gradient inside the through-part in the vapor cell of FIG. 1.

FIG. 3 is a diagram shown for comparing a temperature gradient of the inside of the through-part 105 in the vapor cell according to FIG. 1.

Specifically, (a) of FIG. 3 is a diagram showing the results of thermal analysis inside the through-part 105 when a voltage is applied to the silicon body 100 of the vapor cell according to FIG. 1, and (b) of FIG. 3 is a diagram showing the results of thermal analysis inside the through-part 105 when a voltage is applied to heating patterns after the heating patterns are formed respectively on the surfaces of the first glass substrate 110 and the second glass substrate 120 of the vapor cell according to FIG. 1. Also, (c) of FIG. 3 is a diagram showing a temperature gradient according to the height of the through-part 105 (that is, the length of the through-part 105 corresponding to the length from the upper surface of the first glass substrate 110 to the lower surface of the second glass substrate 120) in the cases of (a) and (b) of FIG. 3.

According to FIG. 3, it can be understood that a relatively constant temperature gradient is exhibited according to the height of the through-part 105 when a voltage is directly applied to the silicon body 100 than when a voltage is applied to the heating patterns after the heating patterns are formed on the surfaces of the first glass substrate 110 and the second glass substrate 120, respectively.

In the chip-scale atomic clock, the width of the vapor cell in a left and right direction (A-A' direction in FIG. 1) and a front and rear direction (B-B' direction in FIG. 1) is generally 2 mm or less. As a result, when a voltage is applied to opposite ends of the silicon body 100 (for example, when a voltages is applied to both left and right ends of the silicon body 100, as shown in FIG. 2), it becomes possible to show a relatively constant temperature distribution according to the height of the through-part 105.

Therefore, according to the present invention, it is possible to create a constant operating temperature environment for the reactive substance by applying a voltage to the silicon body 100, thereby contributing to the improvement of accuracy of the atomic clock.

Here, when the through-part 105 is located at the center of the silicon body 100, the distances from the opposing ends of the silicon body 100 to the through-part 105 become equal to each other. Accordingly, it is possible to keep the temperature inside the through-part 105 to be more constant.

However, since silicon that forms the silicon body 100 is not a material having an electrically good conductivity, it may be required to apply a high voltage when adjusting the temperature inside the through-part 105. In this case, a predetermined amount of p-type or n-type impurity is implanted into the silicon body 100 by ion implantation or the like, so that the resistance of silicon can be reduced. As a result, the temperature inside the through-part 105 can be adjusted (that is, the power consumption is reduced) by applying a voltage lower than before impurity implantation.

Figure 4:
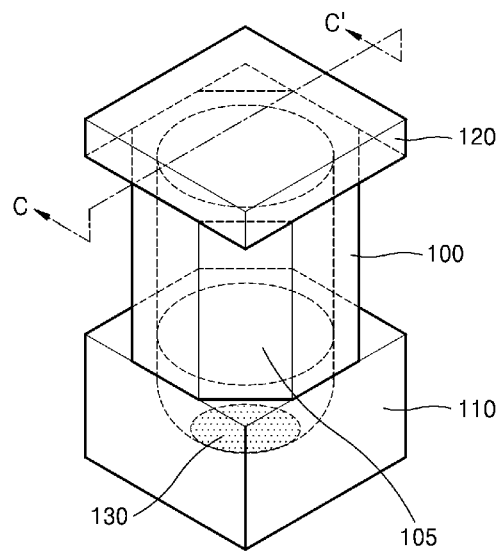
FIG. 4 is a perspective view of a vapor cell according to another embodiment of the present invention.
Figure 5:
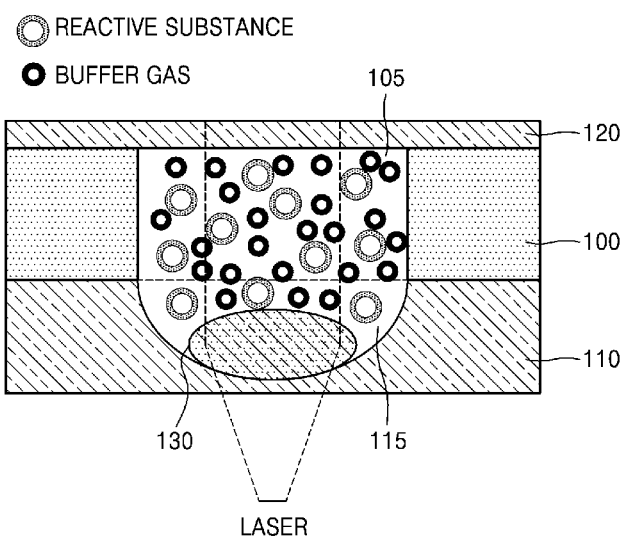
FIG. 5 is a cross-sectional view taken along the line C-C' of FIG. 4.

On the other hand, FIG. 4 is a perspective view of a vapor cell according to another embodiment of the present invention, and FIG. 5 is a cross-sectional view taken along line C-C' of FIG. 4.

Referring to FIGS. 4 and 5, the vapor cell according to another embodiment of the present invention is different from the vapor cell according to one embodiment of the present invention in that the thickness of the first glass substrate 110 is thicker, a collimator 130 is provided inside the first glass substrate 110, and the silicon body 100 has an octagonal column shape.

In relation to the shape of the silicon body 100, a vapor cell which constitutes an atomic clock generally takes the shape of a rectangular column such as a cube or a rectangular parallelepiped as shown in FIG. 1.

However, since the volume of the silicon body 100 is one of main factors affecting power consumption in chip-scale devices, a scheme for minimizing it needs to be prepared. At this case, the fact that the silicon body 100 also functions as a terminal should be also considered together.

In consideration of such circumstances, the silicon body 100 may preferably have a shape of a cylindrical column or a 2n (n is an integer of 3 or more)polygonal column, such as a hexagonal column, an octagonal column, etc., which is smaller in volume than the rectangular column and the distances from the opposite ends of the silicon body 100 to the through-part 105 are equal to each other. In this case where such shapes are provided, the volume is reduced as compared to the shape of the rectangular column, so that the overall power consumption can be reduced.

On the other hand, the first glass substrate 110 is provided with the first concave portion 115 and a collimator 130.

The first concave portion 115 may be provided, for example, by etching a portion corresponding to one side of the through-part 105 of the first glass substrate 110 shown in FIG. 1. As a result, the first concave portion 115 may be continuously connected to one side of the through-part 105.

Although the thickness of the first glass substrate 110 shown in FIG. 5 is illustrated to be thicker than that of the first glass substrate 110 shown in FIG. 2, which is to clearly show the case where the collimator 130 is located in the first glass substrate 110 in FIG. 5, it will be understood that the thickness of the first glass substrate 110 can be varied in various ways.

The collimator 130 is positioned in the first concave portion 115 and functions to convert the divergent light generated from the light generating unit into a parallel light.

The collimator 130 may be provided by separately integrating a typical collimator(s) in the first concave portion 115 or etching a first glass plate 110 of a flat shape into a predetermined shape (that is, a shape which can convert a divergent light to a parallel light).

Generally in a light generating unit such as a VCSEL, a divergent light having a predetermined radiation angle is generated. Accordingly, in order to focus the divergent light, it is required that another optical element between the light generating unit and the vapor cell is provided. However, in the case where the optical element is thus provided separately, it may cause some difficulty in the integration process since all the light generating unit, the optical element and the vapor cell must be arranged in a row.

Therefore, according to the present invention, a method for solving the difficulty in the above-mentioned integration process can be provided by positioning the collimator 130 in the first concave portion 115.

Figure 6:
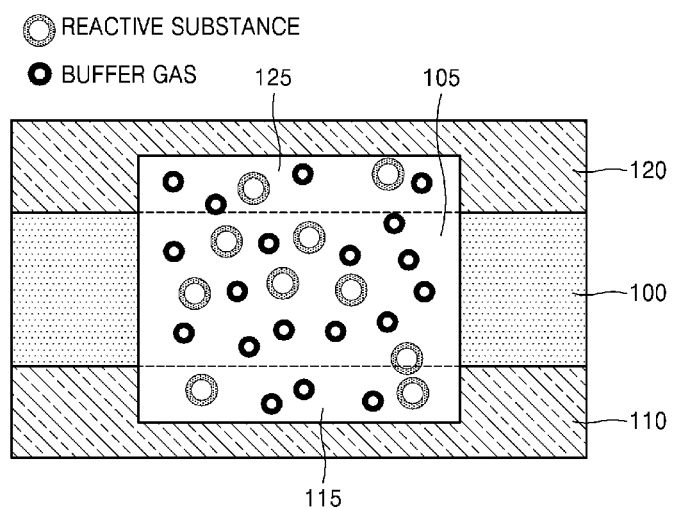
FIG. 6 is a cross-sectional view of a vapor cell according to another embodiment of the present invention.

FIG. 6 is a cross-sectional view of a vapor cell according to another embodiment of the present invention. Referring to FIG. 6, there is a difference from one embodiment of the present invention in that the first concave portion 115 is provided on the first glass substrate 110, and the second concave portion 125 is provided on the second glass substrate 120.

For example, the first concave portion 115 may be provided by etching a portion corresponding to one side of the through-part 105 of the first glass substrate 110 shown in FIG. 1, and the second concave portion 125 may be provided by etching a portion corresponding to the other side of the through-part of the second glass substrate 120 shown in FIG. 1. As a result, the first concave portion 115 is continuously connected to one side of the through-part 105, and the second concave portion 125 is continuously connected to the other side of the through-part 105.

The light generated in the light generation unit passes through in a direction from the first glass substrate 110 to the second glass substrate 120. At this time, it may be advantageous in terms of the light pumping of the reactive substance to increase the travel distance of the light inside the vapor cell.

However, since the silicon body 100 is generally formed by etching a single silicon wafer when producing a vapor cell, there is a limit in thickening the silicon wafer in order to increase the traveling distance of the light.

Accordingly, in order to increase the traveling distance of the light, the present invention suggests a scheme where the first and second concave portions 115, 125 are provided on the first and second glass substrates 110, 120, respectively.

The depths of the first and second concave portions 115, 125 may vary depending on the thicknesses of the first and second glass substrates 110, 120 and the degree of etching for providing the concave portions. However, since the volume of the whole vapor cell increases when the travel distance of the light is increased, it may be preferred to have an appropriate travel distance in consideration of the type of the reactive substance, the intensity of the light generated from the light generating unit, etc.

Although FIG. 6 illustrates that the collimator 130 is not positioned in the first concave portion 115, the collimator 130 for converting the divergent light into parallel light may be provided in the first concave portion 115 as described above.

In the descriptions about the various embodiments of the present invention mentioned above, the silicon body 100 may be characterized in that the silicon body 100 itself functions as a terminal for being wired to an external conductor in order to create the operating temperature environment of the reactive substance contained in the through-part 105.

In this case, the silicon body 100 may be provided to protrude from the first glass substrate 110 and the second glass substrate 120, so that the wiring between the silicon body 100 and the external conductor can be facilitated.

However, when a voltage is directly applied to the silicon body 100 through the external conductor, a state change due to heat such as oxidation of silicon may occur at the bonding junction of the silicon body 100 to which the external conductor is connected.

For this reason, it may be preferred to provide a metal terminal (not shown) to the silicon body 100 in order to facilitate wiring between the silicon body 100 and the outer conductor and prevent the state change due to heat as well. In this case, it may be preferred to provide the metal terminal at the opposite ends of the silicon body 100 relative to the through-part 105 in order to keep the temperature inside the through-part 105 constant.

The metal terminal may be formed by plating a typical metal such as iron, copper, gold, silver, tin, or the like on the silicon body 100 by an electric or chemical method.

The vapor cell having an electro-optical function for the chip-scale atomic clock according to the embodiments of the present invention has been described above. Hereinafter, a method for manufacturing a sealed container for chip-scale devices according to another embodiment of the present invention will be described.

Figure 7:
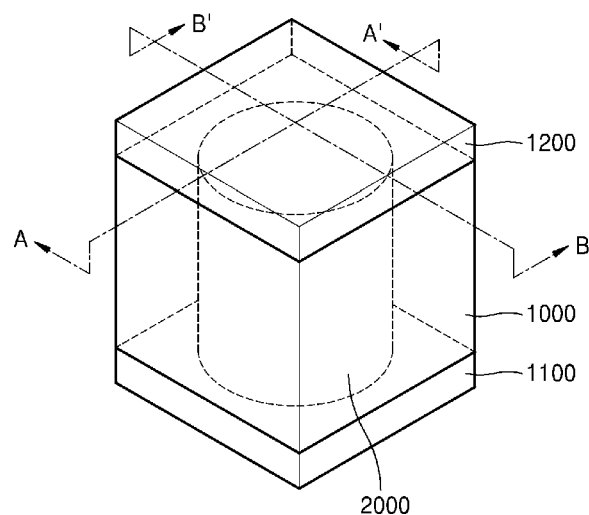
FIG. 7 is a perspective view of a vapor cell (sealed container) used for an atomic clock which is one of chip-scale devices according to another embodiment of the present invention.
Figure 8:
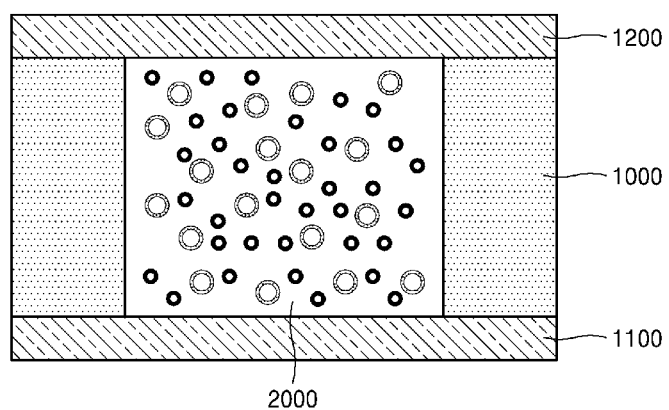
FIG. 8 is a cross-sectional view taken along line A-A' of FIG. 7.

FIG. 7 is a perspective view of a vapor cell (sealed container) used for an atomic clock which is one of chip-scale devices according to another embodiment of the present invention, and FIG. 8 is a cross sectional view taken along the line A-A' of FIG. 7.

In a vapor cell constituting a chip-scale atomic clock which is one of chip-scale devices, a space in which a reactive substance is accommodated is required, and alkali atoms such as cesium or rubidium may be included as the reactive substance contained in the sealed space. Also, the reactive substance is needed to be sealed in the space, which is to ensure the accuracy of the atomic clock by preventing the reactive substance from being affected by external heat or magnetic field.

In addition, it is required that glass substrates are provided on one side on which a light (for example, a laser light) is incident and the other side opposing the one side, respectively, for the light pumping of the reactive substance.

Referring to FIGS. 7 and 8, the silicon body 1000 has a vapor cell region 2000 which penetrates its central portion. The vapor cell region 2000 corresponds to the space in which the reactive substance is contained, and generally has a cylindrical shape. In the vapor cell region 2000, a predetermined buffer gas may be accommodated together with the reactive substance.

Glass substrates 1100, 1200 are provided at lower and upper portions of the silicon body 1000 for allowing the light generated at the light generating unit (not shown) to enter and exit therethrough, respectively.

Specifically, the lower glass substrate 1100 is disposed on one surface of the silicon body 1000 in such a manner as to close one side of the vapor cell region 2000, and the upper glass substrate 1200 is disposed on the other surface of the silicon body 1000 in such a manner as to close the other side of the vapor cell region 2000.

As described above, the reactive substance and the buffer gas are contained in the vapor cell region 2000, and the silicon body 1000 and the glass substrates 1100, 1200 are sealed so that the reactive substances cannot be influenced by an external heat or magnetic field.

Hereinafter, a method for manufacturing the sealed container such as the vapor cell will be described in detail with reference to FIGS. 9 and 10.

Figure 9:
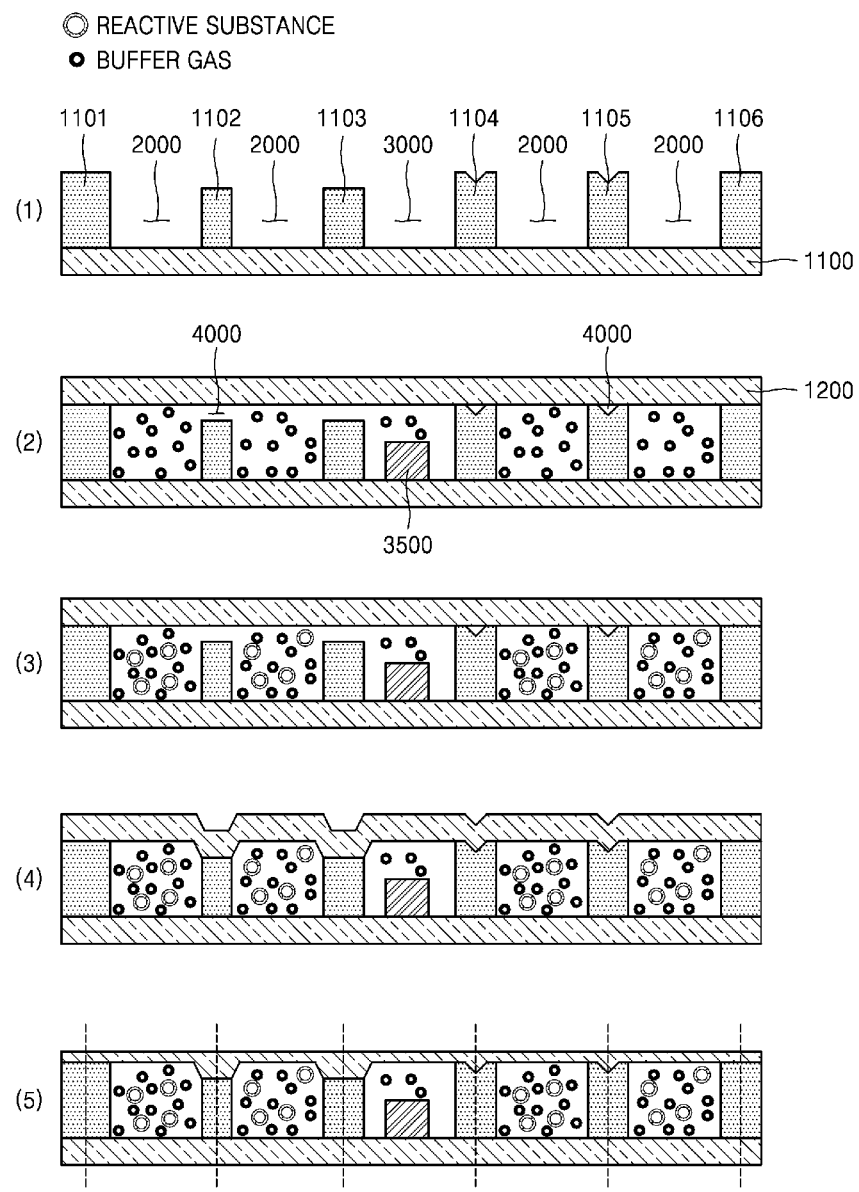
FIG. 9 is a view showing a method for manufacturing a sealed container according to one embodiment of the present invention.

FIG. 9 is a diagram showing a method for manufacturing a sealed container according to one embodiment of the present invention.

In the method for manufacturing the sealed container according to one embodiment of the present invention, firstly, a silicon body 1000 is formed on and between both ends of a lower glass substrate 1100 to divide a vapor cell region 2000 and a dispensing region 3000 on the lower glass substrate 1100, and a channel 4000 through which a reactive substance can flow between the vapor cell region 2000 and the dispensing region 3000 is provided (FIG. 9(1)).

In the present invention, there is not a special difference between the vapor cell region 2000 and the dispensing region 3000, while the vapor cell region 2000 means a space in which the reactive substance in a gaseous state and the buffer gas are contained, and the dispensing region 3000 means a space in which a reactive substance in a solid state, that is, a reactive substance pill is accommodated.

Although one or more vapor cell region 2000 and dispensing region 3000 may be respectively provided, the vapor cell may be produced by partitioning the vapor cell region 2000 into a plurality of regions, while the dispensing region 3000 is made to only one region as shown in FIG. 9. In this case, it is possible to manufacture a plurality of vapor cells through a single process, thereby improving the productivity as compared to prior arts.

In the present invention, the channel 4000 means a passage through which the reactive substance in a gaseous state and the buffer gas can communicate between the vapor cell region 2000 and the dispensing region 3000. Although the channel 4000 does not clearly appear in FIG. 9(1), it can be understood from FIG. 9(2) and the like that channels 4000 are provided between silicon bodies 1102, 1103, 1104, 1105 and an upper glass substrate 1200, which will be described below.

In the method for manufacturing the sealed container according to one embodiment of the present invention, the channels 4000 may be provided by firstly making the height of the silicon bodies 1101, 1106 formed at both ends of the lower glass substrate 1100 equal to each other, and then forming the height of the silicon bodies 1102, 1103 formed between both ends of the lower glass substrate 1100 to be lower than the height of the silicon bodies 1101, 1106 formed at the both ends.

Alternatively, in the method for manufacturing the sealed container according to one embodiment of the present invention, the channels 4000 may be provided by making the height of the silicon bodies 1101, 1104, 1105, 1106 which are formed on and between both ends of the lower glass substrate 1100 equal to each other, and forming recesses in the upper surfaces of the silicon bodies 1104, 1105 formed between both ends of the lower glass substrate 1100.

After forming the silicon body 1000 and providing the channel 4000 as described above, the buffer gas is injected into the vapor cell region 2000 and the reactive material pill 3500 is accommodated in the dispensing region 3000 (FIG. 9(2)). For example, Cs-pill (a mixture of $CsCrO_4$ and Zr—Al alloy) may be accommodated in the dispensing area (3000) to fabricate a vapor cell used for atomic clocks.

Next, the upper glass substrate 1200 is bonded to the upper portions of the silicon bodies 1101, 1106 formed at both ends of the lower glass substrate 1100, and the buffer gas injected into the vapor cell region 200 is sealed from the outside (FIG. 9(2)). Typical anodic bonding may be used when bonding the upper glass substrate 1200 to the upper portions of the silicon bodies 1101, 1106, whereby the buffer gas of a desired pressure is sealed inside the vapor cell region 2000.

Next, the reactive substance pill 3500 is activated, and the reactive substance in the gaseous state is injected through the channel 4000 into the vapor cell region 2000 (FIG. 9(3)). In general, a laser may be used to activate the reactive material pill 3500, and the reactive substance in a solid state thus changes into a gaseous state. Then, the reactive substance in the gaseous state moves to the vapor cell region 2000 via the preformed channel 4000. At this time, the lower glass substrate 1100 and the upper glass substrate 1200 are respectively heated to aid the diffusion through the channel 4000 of the reactive substance in the gaseous state (for example, a vaporized alkali metal). Here, it may be preferred that the upper glass substrate 1200 is heated to a temperature higher than that of the lower glass substrate 1100 in order to prevent condensation of the reactive substance on the upper glass substrate 1200. With this, the portions of the upper glass substrate 1200 which correspond to the channels 4000 are prevented from being contaminated by the reactive substance, so that it is possible for the upper glass substrate 1200 to completely seal the channels 4000 in the channel 4000 closing process, which will be described below.

Next, the portions of the upper glass substrate 1200 which correspond to the channels 4000 are locally heated to close the channels 4000 (FIG. 9(4)). Specifically, when the portions of the upper glass substrate 1200 corresponding to the channels 4000 are locally heated to a temperature higher than the glass transition temperature by using a carbon laser or the like, the channels 4000 are closed with glass (reflow process), whereby the vapor cell region 2000 is sealed.

Next, the silicon bodies 1102, 1103, 1104, 1105 formed between both ends of the lower glass substrate 1100, the lower glass substrate 1100 and the upper glass substrate 1200 adjacent thereto are cut by dicing in the height direction of the silicon bodies 1102, 1103, 1104, 1105 formed between the above-mentioned both ends (FIG. 9(5)). At this time, the silicon bodies 1101, 1106 formed at both ends of the lower glass substrate 1100, the lower glass substrate 1100 and the upper glass substrate 1200 adjacent thereto are also cut by dicing in the height direction of the silicon bodies 1101, 1106 formed at the both ends, so that unnecessary portions can be removed.

Additionally, after the dicing step, a step of polishing the surface of the upper glass substrate 1200 roughened by the reflow process may be performed (FIG. 9(5)).

Meanwhile, FIG. 10 is a diagram showing a method for manufacturing a sealed container according to another embodiment of the present invention.

The another embodiment of the present invention has a difference in the manufacturing method of the sealed container due to a difference in the formation method of the channel 4000 from the one embodiment of the present invention described above, for which descriptions overlapping with the explanations about the one embodiment of the present invention may be simplified or omitted hereinafter.

In the method for manufacturing the sealed container according to the another embodiment of the present invention, at first, a silicon body 1000 having an equal height is formed on and between both ends of a lower glass substrate 1100 to divide a vapor cell region 2000 and a dispensing region 3000 on the lower glass substrate 1100, and a sub silicon body 1010 which has a height lower than that of the silicon body 1000 is formed adjacent to the silicon bodies 1101, 1106 formed at the both ends (FIG. 10(1)).

The reason why the sub silicon body 1010 is formed to have the height lower than that of the silicon body 1000 is that when the bonding portion 1020 which will be described below is melted by heating, the melted bonding portion 1020 is hardened to have a height corresponding to the difference in height between the silicon body 1000 and the sub silicon body 1010, so that the upper glass substrate 1200 can be bonded to upper portions of the silicon body 1000 to seal the vapor cell region 2000 and the dispensing region 3000.

Although one or more vapor cell region 2000 and dispensing region 3000 may be respectively provided, the vapor cell may be produced by partitioning the vapor cell region 2000 into a plurality of regions, while the dispensing region 3000 is made to only one region, as shown in FIG. 10. In this case, it is possible to manufacture a plurality of vapor cells through a single process, thereby improving the productivity as compared to prior arts.

After forming the silicon body 1000 and the sub-silicon body 1010 as described above, the bonding portion 1020 is deposited on the sub silicon body 1010 such that the total height including the height of the sub silicon body 1010 and the height of the bonding portion 1020 is higher than the height of the silicon body 1000 (FIG. 10(2)).

As described above, the channel 4000 of the present invention means a passage through which a reactive substance in a gaseous state and a buffer gas can be communicated between the vapor cell region 2000 and the dispensing region 3000. Although the channel 4000 does not clearly appear in FIG. 10(2), it should be understood that the channel 4000 can be provided due to the bonding portion 1020 between the silicon bodies 1102, 1103, 1104, 1105 and the upper glass substrate 1200 which will be described below with reference to FIG. 10(3) and the like.

Here, the bonding portion 1020 deposited on the sub silicon body 1010 may be a mixture of metals or a glass frit. At this time, it may be preferred that the metal mixture has a melting point lower than the melting points of the silicon body 1000 and the sub silicon body 1010, and the glass frit has a glass transition temperature which is lower than the melting points of the silicon body 1000 and the sub silicon body 1010.

After depositing the bonding portion 1020 on the sub silicon body (1010) as described above, the buffer gas is injected into the vapor cell region 2000, and the reactive material pill is accommodated in the dispensing region 3000 (FIG. 10(3)). For example, Cs-pill (a mixture of $CsCrO_4$ and Zr—Al Alloy) may be accommodated in the dispensing region 3000 to fabricate a vapor cell used for atomic clocks.

Next, the upper glass substrate 1200 is bonded to the upper portion of the bonding portion 1020, and the buffer gas injected into the vapor cell region 2000 is sealed from the outside (FIG. 10(3)). When bonding the upper glass substrate 1200 to the upper portion of the bonding portion 1020, typical eutectic bonding may be used, whereby the buffer gas of a desired pressure is sealed inside the vapor cell region 2000.

Next, the reactive substance pill 3500 is activated, the reactive substance in the gaseous state is injected through the channel 4000 into the vapor cell region 2000 (FIG. 10(4)). A laser can be used to activate the reactive substance pill 3500, by which the reactive substance in a solid state is thus changed into the gaseous state. Then, the reactive substance in the gaseous state moves to the vapor cell region 2000 via the preformed channel 4000. At this time, the lower glass substrate 1100 and the upper glass substrate 1200 are respectively heated to aid the diffusion of the reactive substance in the gaseous state (for example, a vaporized alkali metal) through the channel 4000. Here, it may be preferred that the upper glass substrate 1200 is heated to a temperature higher than that of the lower glass substrate 1100 in order to prevent condensation of the reactive substance on the upper glass substrate 1200.

Next, the bonding portion 1020 is melted and the upper glass substrate 1200 is joined to the upper portion of the silicon body 1000 (FIG. 10(5)). In the another embodiment of the present invention, unlike the one embodiment of the present invention, the silicon bodies 1101, 1102, 1103, 1104, 1105, 1106 are formed to have the same height. Accordingly, when the upper glass substrate 1200 is bonded to the upper portion of the silicon body 1000, the vapor cell region 2000 can be sealed. Typical anodic bonding may be used when joining the upper glass substrate 1200 to the upper portion of the silicon body 1000.

Here, it may be preferred that the melting of the bonding portion 1020 for bonding the upper glass substrate 1200 to the upper portion of the silicon body 1000 is carried out at a higher temperature than the previously performed bonding of the upper glass substrate 1200 to the upper portion of the bonding portion 1020. This is to allow the bonding portion 1020 not to be melted when bonding the upper glass substrate 1200 to the upper portion of the bonding portion 1020, and then to allow the bonding portion 1020 to be melted when bonding the upper glass substrate 1200 to the upper portion of the silicon body 1000, in consideration of that the melting point (or glass transition temperature) of the metal mixture (or glass frit) which corresponds to the bonding portion 1020 is lower than the melting points of the silicon body 1000 and the sub silicon body 1010.

The bonding portion 1020 melted in the anodic bonding process is hardened on the sub silicon body 1010, and at this time, the total height of the silicon body 1010 and the melted bonding portion 1020 should be the same as the height of the silicon body 1000. However, when the amount of the melted bonding portion 1020 is excessive as compared to the difference in height between the silicon body 1000 and the sub silicon body 1010, the upper glass substrate 1200 (2000) may not completely close the vapor cell region 2000. Therefore, a sub silicon body 1010 provided with a guiding portion 1015 of a predetermined size may be used, if necessary. In this case, as the bonding portion 1020 melted at the time of anodic bonding is drawn into the guiding portion 1015, the total height of the sub silicon body 1010 and the melted bonding portion 1020 may be adjusted.

Next, the silicon bodies 1102, 1103, 1104, 1105 formed between both ends of the lower glass substrate 1100, the lower glass substrate 1100 and the upper glass substrate 1200 adjacent thereto are cut by dicing in the height direction of the silicon bodies 1102, 1103, 1104, 1105 formed between the above-mentioned both ends (FIG. 10(6)). At this time, the silicon bodies 1101, 1106 formed at both ends of the lower glass substrate 1100, the lower glass substrate 1100 and the upper glass substrate 1200 adjacent thereto are also cut by dicing in the height direction of the silicon bodies 1101, 1106 formed at the both ends, so that unnecessary portions can be removed.

As described above, according to the method for manufacturing the sealed container of the present invention, unlike prior arts, it is possible to inject only the reactive substance in the gaseous state and the buffer gas into the vapor cell region 2000. Further, since it is unnecessary to provide a separate space for accommodating the reactive substance pill in the vapor cell region 2000 itself, the size of the sealed container thus manufactured can be reduced, whereby the power consumption supplied to the vapor cell can be reduced.

Furthermore, in the present invention, it is also possible to produce a sealed container by providing a plurality of vapor cell regions 2000 and only one dispensing region 3000. In this case, a plurality of sealed containers can be produced through a single manufacturing process, so that the productivity of the sealed container can be greatly improved.

As described above, the present invention has been described with reference to the exemplary embodiments and accompanying drawings. However, it will be apparent that the present invention is not limited to the aforementioned embodiments and a person skilled in the art could make various changes and modifications based on the descriptions. Therefore, it should be appreciated that the technical idea of the present invention must be constructed only by the

What is claimed is:

1. A vapor cell having an electro-optical function for a chip-scale atomic clock, the vapor cell comprising:
   a silicon body having a through-part which is a space where a reactive substance is contained;
   a first glass substrate which is disposed on one surface of the silicon body and closes one side of the through-part; and
   a second glass substrate which is disposed on the other surface of the silicon body and closes the other side of the through-part,
   wherein a voltage is applied to the silicon body to control a temperature inside the through-part.

2. The vapor cell according to claim 1, wherein the through-part is positioned at a center of the silicon body.

3. The vapor cell according to claim 1, wherein a predetermined amount of a p-type or n-type impurity is implanted into the silicon body.

4. The vapor cell according to claim 1, wherein the shape of the silicon body is a 2n (n is an integer of 3 or more) polygonal or cylindrical column.

5. The vapor cell according to claim 1, further comprising:
   a first concave portion which is provided to the first glass substrate and continuously connected to one side of the through-part; and
   a collimator which is disposed in the first concave portion and converts the light incident on the first glass substrate into a parallel light.

6. The vapor cell according to claim 1, further comprising:
   a first concave portion which is provided to the first glass substrate and continuously connected to one side of the through-part; and
   a second concave portion which is provided to the second glass substrate and continuously connected to the other side of the through-part.

7. The vapor cell according to claim 1, further comprising:
   a metal terminal for wiring to external conductors at both opposing ends of the silicon body relative to the through-part.

8. A method for manufacturing a sealed container for a chip-scale device, the method comprising the steps of:
   (A) forming a silicon body on and between opposite ends of a lower glass substrate so as to be partitioned into a vapor cell region and a dispensing region on the lower glass substrate, and providing a channel through which a reactive substance can be communicated between the vapor cell region and the dispensing region;
   (B) injecting a buffer gas into the vapor cell region and accommodating a reactive substance pill in the dispensing region;
   (C) sealing the buffer gas from the outside by bonding an upper glass substrate to an upper portion of the silicon body formed at the opposite ends;
   (D) activating the reactive substance pill to inject the reactive substance of a gaseous state through the channel into the vapor cell region;
   (E) locally heating a portion of the upper glass substrate which corresponds to the channel to close the channel; and
   (F) dicing the silicon body formed between the opposite ends, the lower glass substrate and the upper glass substrate adjacent thereto in a height direction of the silicon body formed between the opposite ends,
   wherein the channel is provided by making the height of the silicon body formed on and between the opposite ends of the lower glass substrate equal and forming a concave portion on an upper surface of the silicon body formed between the opposite ends of the lower glass substrate.

9. The method according to claim 8, wherein the dispensing region is one, and the vapor cell region is plural.

10. The method according to claim 8, further comprising:
    polishing a surface of the upper glass substrate after the step (E).

11. A method for manufacturing a sealed container for a chip-scale device, the method comprising the steps of:
    (a) forming a silicon body having an equal height on and between opposite ends of a lower glass substrate so as to be partitioned into a vapor cell region and a dispensing region on the lower glass substrate, and forming a sub silicon body which has a height lower than a height of the silicon body adjacent to the silicon body formed on the opposite ends;
    (b) depositing a bonding portion on the sub silicon body such that a total height including the height of the sub silicon body and a height of the bonding portion is higher than the height of the silicon body;
    (c) injecting a buffer gas into the vapor cell region and accommodating a reactive substance pill in the dispensing region;
    (d) sealing the buffer gas from the outside by bonding an upper glass substrate to an upper portion of the bonding portion;
    (e) activating the reactive substance pill to inject the reactive substance of a gaseous state into the vapor cell region;
    (f) melting the bonding portion to bond the upper glass substrate to an upper portion of the silicon body; and
    (g) dicing the silicon body formed between the opposite ends, the lower glass substrate and the upper glass substrate adjacent thereto in a height direction of the silicon body formed between the opposite ends.

12. The method according to claim 11, wherein the bonding portion is a metal mixture having a melting point lower than melting points of the silicon body and the sub silicon body, and
    the step (f) is carried out at a higher temperature than the step (d).

13. The method according to claim 11, wherein the bonding portion is a glass frit having a glass transition temperature lower than melting points of the silicon body and the sub silicon body, and
    the step (f) is carried out at a higher temperature than the step (d).

14. The method according to claim 11, wherein a guiding portion is further provided, and
    when the upper glass substrate is bonded to the upper portion of the silicon body in the step (f), the bonding portion is melted and drawn into the guiding portion.

15. The method according to claim 11, wherein the dispensing region is one, and the vapor cell region is a plural.

* * * * *

UNITED STATES PATENT AND TRADEMARK OFFICE
CERTIFICATE OF CORRECTION

PATENT NO. : 10,447,286 B2  
APPLICATION NO. : 15/747734  
DATED : October 15, 2019  
INVENTOR(S) : Jong Cheol Park et al.

Page 1 of 1

It is certified that error appears in the above-identified patent and that said Letters Patent is hereby corrected as shown below:

On the Title Page

(30) Foreign Application Priority Data should read:  
July 30, 2015 (KR) 10-2015-0108315  
July 30, 2015 (KR) 10-2015-0108253

Signed and Sealed this  
Twenty-eighth Day of April, 2020

Andrei Iancu  
*Director of the United States Patent and Trademark Office*